US010396798B2

(12) United States Patent
Bai et al.

(10) Patent No.: US 10,396,798 B2
(45) Date of Patent: Aug. 27, 2019

(54) RECONFIGURABLE CIRCUIT

(71) Applicant: NEC Corporation, Minato-ku, Tokyo (JP)

(72) Inventors: Xu Bai, Tokyo (JP); Toshitsugu Sakamoto, Tokyo (JP); Munehiro Tada, Tokyo (JP); Yukihide Tsuji, Tokyo (JP); Ayuka Tada, Tokyo (JP); Makoto Miyamura, Tokyo (JP); Ryusuke Nebashi, Tokyo (JP)

(73) Assignee: NEC CORPORATION, Tokyo (JP)

( * ) Notice: Subject to any disclaimer, the term of this patent is extended or adjusted under 35 U.S.C. 154(b) by 0 days.

(21) Appl. No.: 15/767,683

(22) PCT Filed: Oct. 16, 2015

(86) PCT No.: PCT/JP2015/005239
§ 371 (c)(1),
(2) Date: Apr. 12, 2018

(87) PCT Pub. No.: WO2017/064744
PCT Pub. Date: Apr. 20, 2017

(65) Prior Publication Data
US 2018/0302094 A1    Oct. 18, 2018

(51) Int. Cl.
H03K 19/173 (2006.01)
H03K 19/177 (2006.01)
(Continued)

(52) U.S. Cl.
CPC ... *H03K 19/17756* (2013.01); *G06F 15/7867* (2013.01); *G06F 17/5054* (2013.01);
(Continued)

(58) Field of Classification Search
None
See application file for complete search history.

(56) References Cited

U.S. PATENT DOCUMENTS

| | | | | |
|---|---|---|---|---|
| 7,378,879 B1 * | 5/2008 | De La Cruz | ..... | H03K 19/17728 326/105 |
| 7,425,720 B2 * | 9/2008 | Kaeriyama | ......... | G11C 11/5614 257/296 |

(Continued)

OTHER PUBLICATIONS

N. Banno et al., "Reliable Solid-Electrolyte Crossbar Switch for Programmable Logic Device", Symposium on VLSI Technology Digest of Technical Papers, 2010, pp. 115-116.

(Continued)

*Primary Examiner* — Minh D A
*Assistant Examiner* — James H Cho

(57) ABSTRACT

A reconfigurable circuit includes first and second wires and two or more paths active at different times. Each path includes: a first NVRS whose first terminal is connected to the first wire; a first transistor whose drain terminal is connected to a second terminal of the first NVRS; a second NVRS whose first terminal is connected to the second terminal of the first NVRS; a second transistor whose source terminal is connected to a second terminal of the second NVRS and whose drain terminal is connected to the second wire; and a 2-input AND circuit whose output is connected to a gate terminal of the first transistor. A time control signal is supplied to a first input of the 2-input AND circuit and a gate terminal of the second transistor. A write control signal is supplied to a second input of the 2-input AND circuit.

9 Claims, 10 Drawing Sheets

(51) Int. Cl.
*G06F 15/78* (2006.01)
*G06F 17/50* (2006.01)

(52) U.S. Cl.
CPC ....... *H03K 19/173* (2013.01); *H03K 19/1776* (2013.01); *H03K 19/17736* (2013.01); *H03K 19/17748* (2013.01)

(56) References Cited

U.S. PATENT DOCUMENTS

| | | |
|---|---|---|
| 7,486,111 B2 | 2/2009 | Madurawe |
| 8,084,768 B2 | 12/2011 | Kaeriyama et al. |
| 8,816,312 B2 | 8/2014 | Tada et al. |
| 9,355,717 B1 * | 5/2016 | Nazarian ............ G11C 13/0002 |
| 2007/0210826 A1 * | 9/2007 | Madurawe ....... H03K 19/17736 |
| | | 326/38 |
| 2010/0039138 A1 * | 2/2010 | Bertin .................... B82Y 10/00 |
| | | 326/38 |
| 2011/0007554 A1 | 1/2011 | Kaeriyama et al. |
| 2015/0214950 A1 | 7/2015 | Yasuda et al. |

OTHER PUBLICATIONS

S. Kaeriyama et al., "A Nonvolatile Programmable Solid-Electrolyte Nanometer Switch", IEEE Journal of Solid-State Circuits, Jan. 2005, pp. 168-176, vol. 40, No. 1.

M. Miyamura et al., "Low-power Programmable-logic Cell Arrays using Nonvolatile Complementary Atom Switch", 15th Int'l Symposium on Quality Electronic Design, 2014, pp. 330-334.

International Search Report for PCT Application No. PCT/JP2015/005239, dated Nov. 24, 2015.

\* cited by examiner

RELATED ART

|  | previous | proposal |  |
|---|---|---|---|
| delay(ns) | 0.913 | 0.556 | -40% |
| leakage current (A) | 2.57E-08 | 1.27E-08 | -50% |
| Dynamic power (w/MHz) | 9.90E-09 | 6.19E-09 | -37% |
| area(um$^2$) | 16.896 | 19.24 | +14% |

RECONFIGURABLE CIRCUIT

This application is a National Stage Entry of PCT/JP2015/005239 filed on Oct. 16, 2015, the contents of all of which are incorporated herein by reference, in their entirety.

TECHNICAL FIELD

The present invention relates to a reconfigurable circuit using non-volatile resistive switches.

BACKGROUND ART

Semiconductor integrated circuit (IC) is constructed by transistors built on a semiconductor substrate and upper layer wires used to connect transistors. The patterns of the transistors and wires are determined in the IC design stage. The interconnections between the transistors cannot be changed after fabrication.

In reconfigurable circuits such as FPGAs (Field-Programmable Gate Arrays), configuration data including logic operation and interconnection information is stored in memories, so that different logic operations and interconnections can be realized by configuring the memories after fabrication according to requirements of end users. Moreover, multi-context FPGAs with multi-context configuration memory allow most applications to achieve greater logic density than conventional FPGAs by reusing hardware resources, where stored multiple sets of configuration data can be switched quickly in a time-multiplexed manner.

FIG. 1 illustrates a time-multiplexed switch element that can realize runtime-changeable data signal routing described in patent document 1. Four paths are parallel connected between two wires W1 and W2. At each path, a first pass transistor (Tr1-Tr4) controlled by a configuration memory (M1-M4) is serially connected to a second pass transistor (Tr5-Tr8) controlled by a time control signal (S1-S4). Second pass transistors Tr5-Tr8 choose one of the four paths to connect wire W1 with wire W2, and configuration memories M1-M4 that store four kinds of configuration data turn first pass transistors Tr1-Tr4 ON/OFF at different times.

In most of commercial FPGAs, SRAM (Static Random Access Memory) is used to store the configuration data. Typically, each SRAM is composed of 6 transistors and each modern FPGA chip has more than 10M SRAMs, which causes extremely large area overhead and cost.

To overcome the problems of SRAM-based FPGAs, non-volatile resistive switches (NVRSs) integrated between the wires on a transistor layer have been proposed for small area overhead. Non-volatility also contributes to zero standby power consumption.

As an example, in the reconfigurable circuits shown in non-patent document 1 and patent document 2, a non-volatile resistive switch (NVRS) that is composed of a solid-electrolyte sandwiched between an active electrode (Cu) and an inert electrode (Ru) has high OFF/ON resistance ratio ($>10^5$), therefore the NVRS can replace the CMOS switch to achieve small area overhead and high logic density. Moreover, lower capacitance of the NVRS than nMOS transistor leads to low power consumption and high speed. Since the ON/OFF state of the NVRS is a hold state even when not powered, configuration data can be loaded immediately when power is turned on. Non-patent document 3 describes that the NVRS has very small load capacitance.

CITATION LIST

Patent Literature

PTL 1: U.S. Pat. No. 7,486,111B2
PTL 2: U.S. Pat. No. 8,084,768B2
PTL 3: U.S. Pat. No. 8,816,312B2

Non Patent Literature

NPL 1: N. Banno et al., "Reliable Solid-Electrolyte Crossbar Switch for Programmable Logic Device", Symposium on VLSI Technology, pp. 115-116, (2010).
NPL 2: Shunichi Kaeriyama et al., A Nonvolatile Programmable Solid-Electrolyte Nanometer Switch, IEEE Journal of Solid-State Circuits, January 2005, pp. 168-176, vol. 40, No. 1.
NPL 3: Makoto Miyamura et al., Low-power programmable-logic cell arrays using nonvolatile complementary atom switch, ISQED 2014, pp. 330-334.

SUMMARY OF INVENTION

Technical Problem

FIG. 2 illustrates a typical 1-transistor-1-NVRS resistive cell (1T1R-NVRC) structure, where the transistor works as a switch for accessing the selected 1T1R-NVSC and isolating unselected ones for high write reliability as shown in non-patent document 2.

FIG. 3 illustrates a time-multiplexed switch element using 1T1R-NVRCs to solve the large area, large static power consumption and large standby power consumption problems in the conventional SRAM-based time-multiplexed switch element. Four paths are parallel connected between two wires W1 and W2. Each path incudes: an NVRS (RS1-RS4); an nMOS transistor (Tr1-1-Tr1-4) that is controlled by common write control signal Ctrl; and an nMOS transistor (Tr2-1-Tr2-4) that is controlled by a time control signal (S1-S4).

However, in the data routing mode, one NVRS and two nMOS transistors are serially connected on each path. In this case, the nMOS transistor, which is large in size, is used to write the NVRS, and this causes large delay. Moreover, when a logic value "1" data signal is transferred through the path, heavily degraded voltage level causes large direct current of next connected CMOS circuit.

Moreover, in write mode, program voltages PV1 and PV2 are supplied to wires W1 and W2, respectively. To set (turn ON) the NVRS, program voltage PV1 is connected to high voltage and program voltage PV2 is connected to ground line GND. Ground line GND can be supplied to the NVRS through the two cascade-connected nMOS transistors without voltage level degradation. Therefore, the NVRS can be correctly turned ON. However, to reset (turn OFF) the NVRS, program voltage PV1 is connected to ground line GND and program voltage PV2 is connected to high voltage. Two cascade-connected nMOS transistors heavily degrade the voltage level of program voltage PV2, which may cause reset failure of the NVRS.

Patent document 3 describes a typical 1T2R NVRC. Similar to the typical 1T1R-NVRC-based time-multiplexed switch element shown in FIG. 3, this typical 1T2R-NVRC also has the above-mentioned reset reliability problem.

An object of the present invention is to provide a high-speed low-power high-reliable NVRS-based time-multiplexed switch element for multi-context FPGA.

Solution to Problem

To accomplish the foregoing object, an aspect of certain exemplary embodiments of the invention provides a reconfigurable circuit comprising:
first and second wires; and
two or more paths that are active at different times and that are configured to couple the first wire to the second wire,
wherein each path includes:
a first non-volatile resistive switch, whose first terminal is connected to the first wire;
a first transistor whose drain terminal is connected to a second terminal of the non-volatile resistive switch and whose source terminal is connected to the second wire; and
a 2-input AND circuit whose output is connected to a gate terminal of the first transistor,
wherein a time control signal is supplied to a first data input of the 2-input AND circuit, and a write control signal is supplied to a second data input of the 2-input AND circuit.

Another aspect of certain exemplary embodiments of the invention provides a reconfigurable circuit comprising:
first and second wires; and
two or more paths that are active at different times and that are configured to couple the first wire to the second wire,
wherein each path includes:
a first non-volatile resistive switch, whose first terminal is connected to the first wire;
a first transistor whose drain terminal is connected to a second terminal of the first non-volatile resistive switch;
a second non-volatile resistive switch whose first terminal is connected to the second terminal of the first non-volatile resistive switch;
a second transistor whose source terminal is connected to a second terminal of the second non-volatile resistive switch and whose drain terminal is connected to the second wire; and
a 2-input AND circuit whose output is connected to a gate terminal of the first transistor,
wherein a time control signal is supplied to both a first data input of the 2-input AND circuit and a gate terminal of the second transistor, and a write control signal is supplied to a second data input of the 2-input AND circuit.

A further aspect of certain exemplary embodiments of the invention provides a reconfigurable circuit comprising:
first and second wires; and
two or more paths that are active at different times and that are configured to couple the first wire to the second wire,
wherein each path includes:
a first non-volatile resistive switch, whose first terminal is connected to the first wire;
a first transistor whose drain terminal is connected to a second terminal of the first non-volatile resistive switch;
a second transistor whose source terminal is connected to a second terminal of the first non-volatile resistive switch;
a second non-volatile resistive switch whose first terminal is connected to a drain terminal of the second transistor and whose second terminal is connected to the second wire; and
a 2-input AND circuit whose output is connected to a gate terminal of the first transistor,
wherein a time control signal is supplied to both a first data input of the 2-input AND circuit and a gate terminal of the second transistor, and a write control signal is supplied to a second data input of the 2-input AND circuit.

Advantageous Effects of Invention

According to the present invention, a high-speed low-power high-reliable runtime-changeable data signal routing for multi-context FPGA can be realized.

The following description refers in more detail to the various features and steps of the present invention. To facilitate an understanding of the invention, reference is made in the description to the accompanying drawings where the invention is illustrated in a preferred embodiment. It is to be understood however that the invention is not limited to the preferred embodiment illustrated in the drawings.

DESCRIPTION OF EMBODIMENTS

First Exemplary Embodiment

Figure 4:
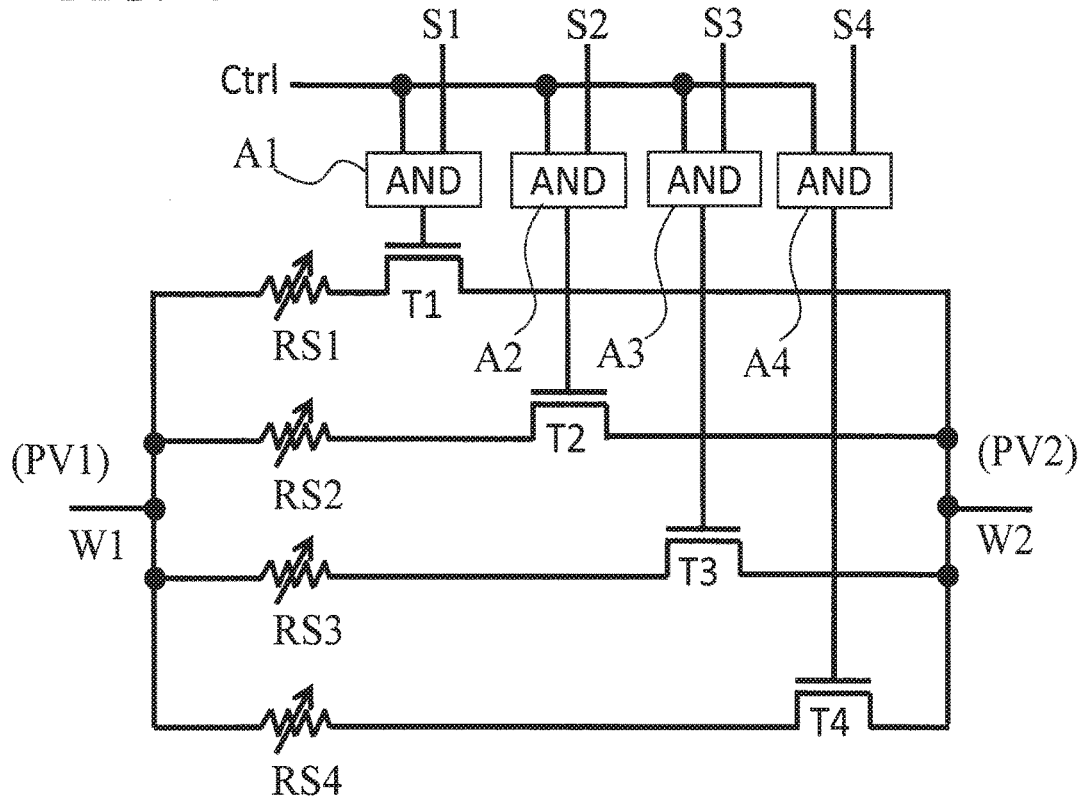
FIG. 4 illustrates a 1T1R-NVRC-based time-multiplexed switch element according to a first exemplary embodiment of the present invention.

A first exemplary embodiment of the present invention will be described. FIG. 4 illustrates a 1T1R-NVRC-based time-multiplexed switch element in which write and time control transistors are shared according to the first exemplary embodiment. Four paths are parallel connected between two wires W1 and W2. The number of paths is not limited to four. Two or more paths may be parallel connected between wires W1 and W2.

Each path includes an NVRS (RS1-RS4), a pass transistor (T1-T4) and a 2-input AND circuit (A1-A4). On the first path, the first terminal of NVRS RS1 is connected to wire W1, and the second terminal of NVRS RS1 is connected to the drain terminal of the pass transistor T1 which is composed of an nMOS transistor. The gate terminal of pass transistor T1 is connected to the output of 2-input AND circuit A1. The source terminal of pass transistor T1 is connected to wire W2.

On the second path, the first terminal of NVRS RS2 is connected to wire W1, and the second terminal of NVRS RS2 is connected to the drain terminal of pass transistor T2 which is composed of an nMOS transistor. The gate terminal of pass transistor T2 is connected to the output of 2-input AND circuit A2. The source terminal of pass transistor T2 is connected to wire W2.

On the third path, the first terminal of NVRS RS3 is connected to wire W1, and the second terminal of NVRS RS3 is connected to the drain terminal of pass transistor T3 which is composed of an nMOS transistor. The gate terminal of pass transistor T3 is connected to the output of 2-input AND circuit A3. The source terminal of pass transistor T3 is connected to wire W2.

On the fourth path, the first terminal of NVRS RS4 is connected to wire W1, and the second terminal of NVRS RS4 is connected to the drain terminal of pass transistor T4 which is composed of an nMOS transistor. The gate terminal of pass transistor T4 is connected to the output of 2-input AND circuit A4. The source terminal of pass transistor T4 is connected to wire W2.

Common write control signal Ctrl is supplied to first data inputs of four 2-input AND circuits A1-A4, and four time control signals S1-S4 are supplied to second inputs of four 2-input AND circuits A1-A4 in a one-to-one relationship. On each path, a NVRS is serially connected to only one nMOS transistor, which leads to high reliability of reset operation.

In write mode, program voltages PV1 and PV2 are supplied to W1 and W2, respectively. In the case where NVRS RS1 on the first path is to be configured, both common write control signal Ctrl and time control signal S1 are set to HIGH, time control signals S2, S3 and S4 are set to LOW. Pass transistor T1 on the first path is turned ON, and the other pass transistors on the other paths are turned OFF. Thus, program voltages PV1 and PV2 are supplied to two terminals of NVRS RS1 for configuration.

In data routing mode, common write control signal Ctrl is set to HIGH, and one of time control signals S1-S4 is set to HIGH at one time to enable one of the four paths. For example, if we want to enable second path, time control signal S2 is set to HIGH to turn ON pass transistor T2. At the same time, time control signals S1, S3 and S4 are set to LOW to turn OFF pass transistors T1, T3 and T4. Thus, the second path becomes active and NVRS RS2 can control data transfer between wires W1 and W2.

Figure 5A:
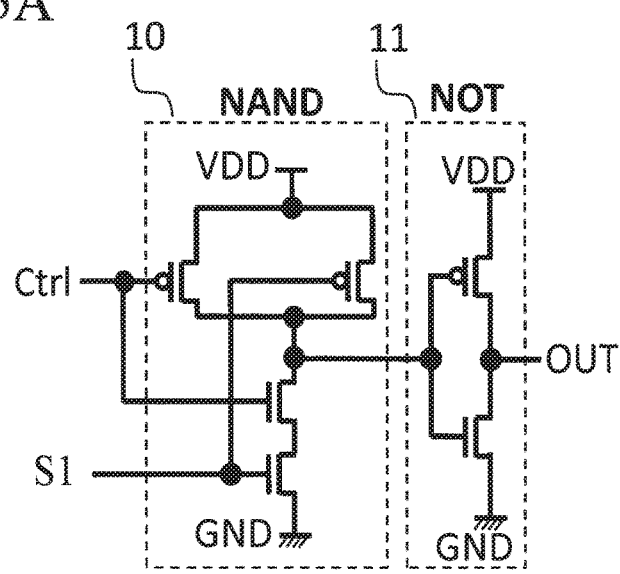
FIG. 5A illustrates the first kind of 2-input AND circuit.

FIG. 5 illustrates two kinds of 2-input AND circuit designs. FIG. 5A shows the first kind of 2-input AND circuit. This 2-input AND circuit includes NAND gate 10 which is a typical CMOS NAND gate and NOT gate 11 which is a typical CMOS NOT gate. The output of NAND gate 10 is supplied to the input of NOT gate 11. To construct the novel 1T1R-NVRC-based time-multiplexed switch element shown in FIG. 4, it is necessary to use 24 (=4×6) transistors to implement the four 2-input AND circuits, which causes a large area overhead even though size of the transistor in the 2-input AND circuit is much smaller than the transistor (T1-T4) on each path.

Figures 5B, 6:
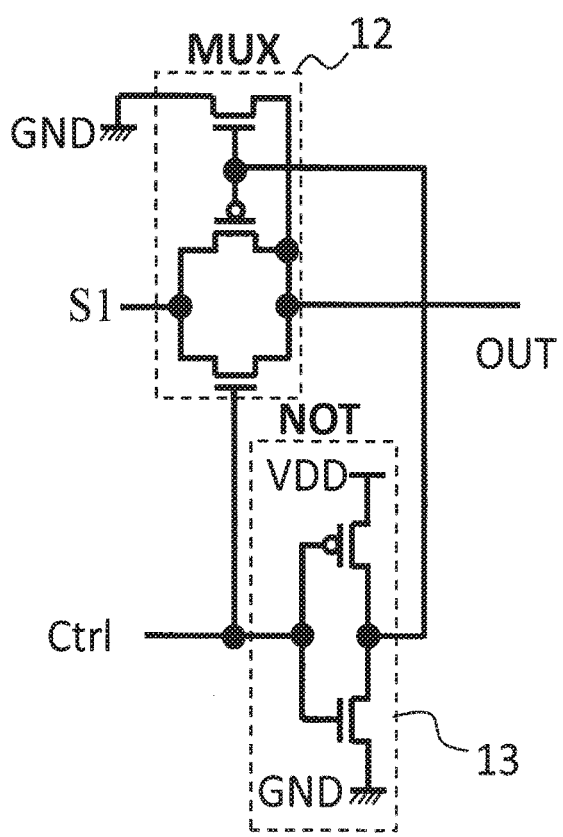
FIG. 5B illustrates the second kind of 2-input AND circuit.
FIG. 6 illustrates performance comparison between the previous time-multiplexed switch element and the 1T1R-NVRC-based time-multiplexed switch element according to the first exemplary embodiment of the present invention.

FIG. 5B shows the second kind of 2-input AND circuit. This 2-input AND circuit includes 2-input multiplexer (2-MUX) 12 and NOT gate 11 which is a typical CMOS NOT gate. Common write control signal Ctrl is used to select time control signal S1 or ground line (GND) as the output of 2-MUX 12 to implement 2-input AND function. NOT gate 11 that is used to generate inverse voltage of common write control signal Ctrl can be shared by the other 2-input AND circuits shown in FIG. 4, which leads to small area overhead. In 2-MUX 12, time control signal S1 is supplied to a transmission gate for full-swing signal transfer, and ground line GND is supplied to an nMOS pass transistor which has no voltage degrade for logic zero. Therefore, to construct the novel 1T1R-NVRC-based time-multiplexed switch element shown in FIG. 4, only fourteen transistors are needed because the second kind of 2-input AND circuit is used.

Figure 1:
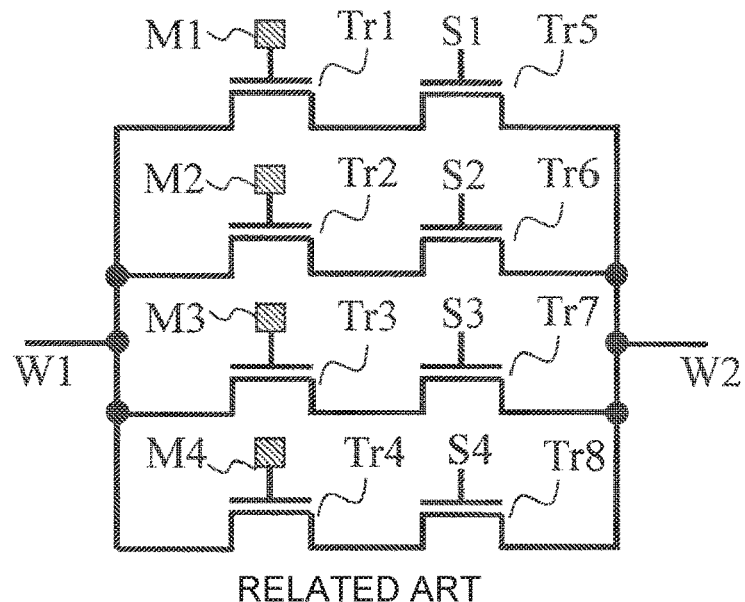
FIG. 1 illustrates a conventional time-multiplexed switch element.
Figure 2:
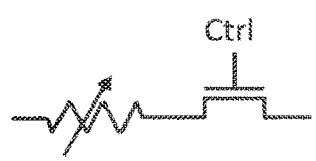
FIG. 2 illustrates a typical 1T1R NVRC.
Figure 3:
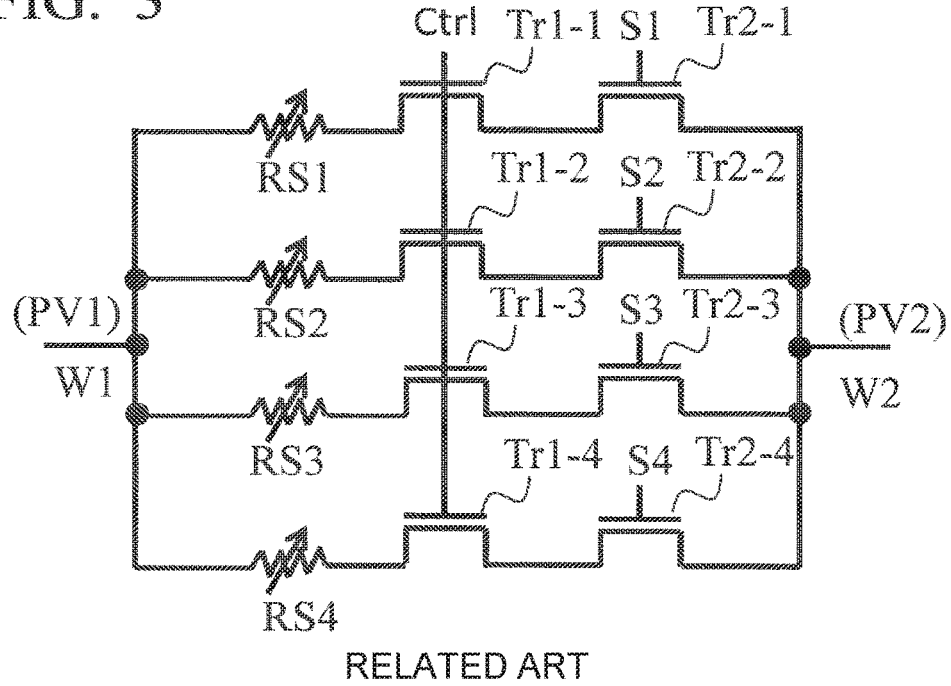
FIG. 3 illustrates a time-multiplexed switch element using typical 1T1R NVRCs.

FIG. 6 illustrates performance comparison between the proposed 1T1R-NVRC-based time-multiplexed switch element using the second kind of 2-input AND circuits shown in FIG. 4 and the previous time-multiplexed switch element using typical 1T1R NVRCs shown in FIG. 3. The HSPICE simulation based on the 65 nm CMOS rule (using "HSPICE" of Synopsys, Inc.) has been performed. In comparison with the previous time-multiplexed switch element, the proposed time-multiplexed switch element achieves 40%, 50% and 37% reduction of delay, leakage current and dynamic power consumption, respectively, with only a 14% increase of area.

In the proposed 1T1R-NVRC-based time-multiplexed switch element in which write and time select transistors are shared, the NVRS is serially connected with only one large-size nMOS transistor on each path, which leads to a small delay and a small direct current flowing through the next connected CMOS circuit compared with the previous time-multiplexed switch element. The 2-input AND circuit constructed by normal-size transistors leads to a very small area overhead.

Second Exemplary Embodiment

Next, a second exemplary embodiment according to the present invention will be described. The present embodiment discloses a time-multiplexed crossbar switch using the proposed 1T1R-NVRC-based time-multiplexed switch elements. Area overhead can be greatly reduced.

Figure 7:
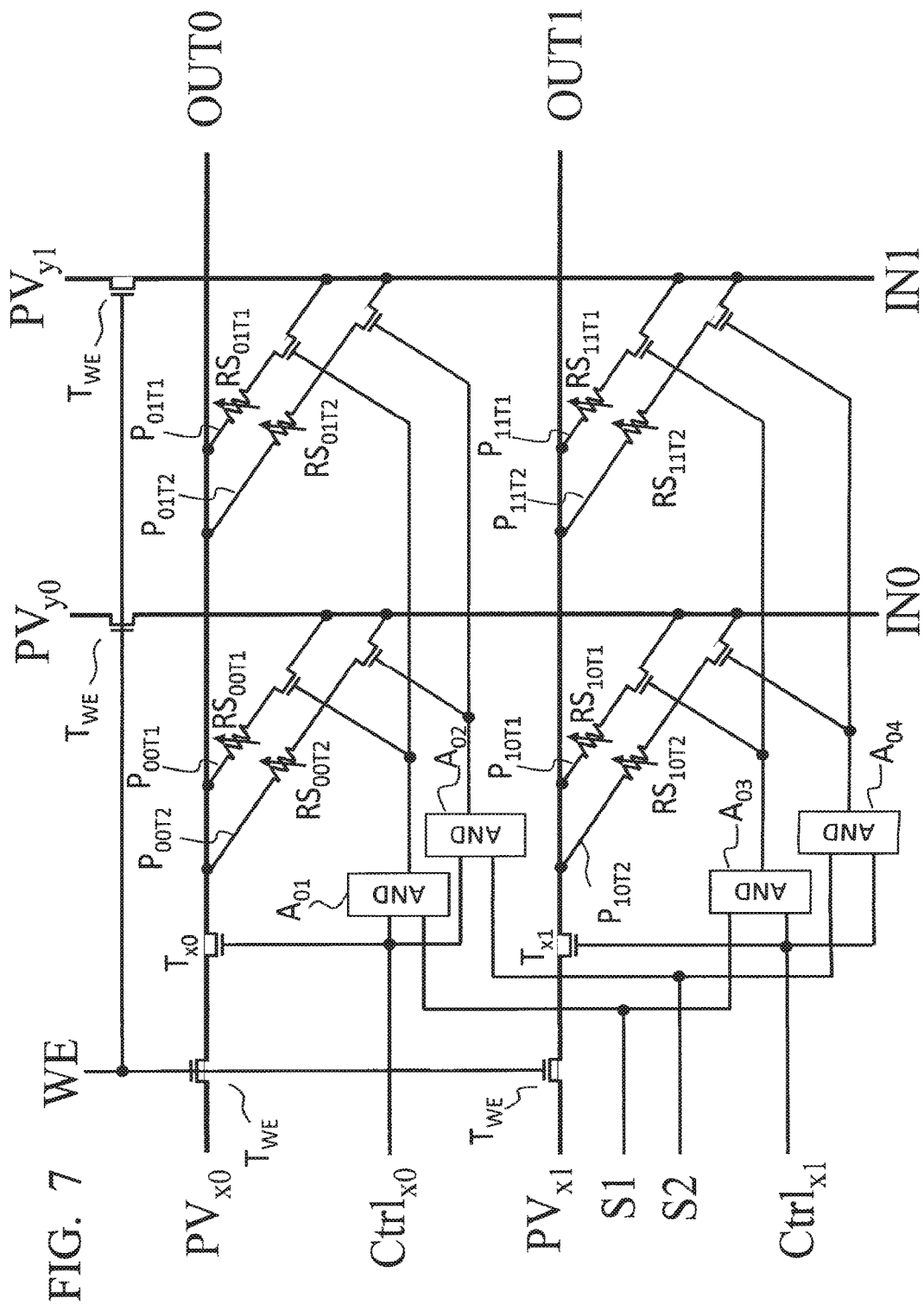
FIG. 7 illustrates a crossbar switch using 1T1R-NVRC-based time-multiplexed switch elements according to a second exemplary embodiment of the present invention.

FIG. 7 illustrates the proposed 1T1R-NVRS-based time-multiplexed crossbar switch (which uses a 2×2 crossbar switch and two time states as an example) that includes two column wires and two row wires. At each crosspoint, the proposed 1T1R-NVRC-based time-multiplexed switch element with two paths couples a column wire to a row wire. The column and row wires are used for both data transfer and NVRS write operation. Data is supplied to bottom terminals of column wires, and output from right terminals of row wires.

The source terminal of row write control transistor $T_{x0}$ is connected to the left terminal of the row wire in row x0. The drain terminal of row write control transistor $T_{x0}$ is connected to the source terminal of first write enable transistor $T_{WE}$ whose drain terminal is connected to row program voltage signal line $PV_{x0}$. Row write control signal $Ctrl_{x0}$ is supplied to the gate terminal of row write control transistor $T_{x0}$. Row write control transistor $T_{x0}$ operates according to row write control signal $Ctrl_{x0}$ and couples the left terminal of the row wire in row x0 to the source terminal of first write enable transistor $T_{WE}$.

The source terminal of row write control transistor $T_{x1}$ is connected to the left terminal of the row wire in row x1. The drain terminal of row write control transistor $T_{x1}$ is connected to the source terminal of second write enable transistor $T_{WE}$ whose drain terminal is connected to row program voltage signal line $PV_{x1}$. Row write control signal $Ctrl_{x1}$ is supplied to the gate terminal of row write control transistor $T_{x1}$. Row write control transistor $T_{x1}$ operates according to row write control signal $Ctrl_{x0}$ and couples the left terminal of the row wire in row x1 to the source terminal of second write enable transistor $T_{WE}$.

The source terminal of third write enable transistor $T_{WE}$ is connected to the top terminal of the column wire in column y0. The drain terminal of third write enable transistor $T_{WE}$ is connected to column program voltage signal line $PV_{y0}$. Third write enable transistor $T_{WE}$ couples the top terminal of the column wire in column y0 to column program voltage signal line $PV_{y0}$. The drain terminals of the transistors on paths $P_{00T1}$, $P_{00T2}$, $P_{10T1}$ and $P_{10T2}$ are connected to the column wire in column y1.

The source terminal of fourth write enable transistor $T_{WE}$ is connected to the top terminal of the column wire in column y1. The drain terminal of fourth write enable transistor $T_{WE}$ is connected to column program voltage signal line $PV_{y1}$. Fourth write enable transistor $T_{WE}$ couples the top terminal of the column wire in column y1 to column program voltage signal line $PV_{y1}$. The drain terminals of the transistors on paths $P_{01T1}$, $P_{01T2}$, $P_{11T1}$ and $P_{11T2}$ are connected to the column wire in column y1.

All the four write enable transistors $T_{WE}$ are controlled by write enable signal WE and active in write mode.

In each row, a 2-input AND circuit is shared to control the same time-state paths at different crosspoints, which leads to a small area overhead. For example, in row x0, 2-input AND circuit $A_{01}$ is used to control transistors on paths $P_{00T1}$ and $P_{01T1}$ that have same time state T1 but at different crosspoints. First inputs of 2-input AND circuits $A_{01}$ and $A_{02}$ in row x0 are connected to a common row write control signal $Ctrl_{x0}$, and first inputs of 2-input AND circuits $A_{03}$ and $A_{04}$ in row x1 are connected to a common row write control signal $Ctrl_{x1}$. Second inputs of 2-input AND circuits $A_{01}$ and $A_{03}$ in same time state T1 are connected to time control signal S1, and second inputs of 2-input AND circuits $A_{02}$ and $A_{04}$ in same time state T2 are connected to time control signal S2.

In the write mode, if we want to set NVRS $RS_{00T2}$ on path $P_{00T2}$, write enable signal WE is set to HIGH to turn ON write enable transistors $T_{WE}$, row write control signal $Ctrl_{x0}$ and time control signal S2 are set to HIGH, and row write control signal $Ctrl_{x1}$ and time control signal S1 are set to LOW. Thus, program voltage signals $PV_{x0}$ and $PV_{y0}$ are supplied to $RS_{00T2}$, then program voltage signal $PV_{x0}$ is set to HIGH, program voltage signals $PV_{x1}$, $PV_{y0}$ and $PV_{y1}$ are set to LOW to set $RS_{00T2}$.

In the data routing mode, write enable signal WE is set to LOW to isolate program voltage signals $PV_{x0}$, $PV_{x1}$, $PV_{y0}$ and $PV_{y1}$. Row write control signals $Ctrl_{x0}$ and $Ctrl_{x1}$ are set to HIGH. When time control signal S1 is HIGH, paths $P_{00T1}$, $P_{01T1}$, $P_{10T1}$ and $P_{11T1}$ are active for data routing, while when time control signal S2 is HIGH, paths $P_{00T2}$, $P_{01T2}$, $P_{10T2}$ and $P_{11T2}$ are active for data routing.

Third Exemplary Embodiment

Next, a third exemplary embodiment according to the present invention will be described. The present embodiment discloses a high-reliability time-multiplexed crossbar switch using 1-transistor-2-NVRS resistive cells (1T2R-NVRCs).

First, the reset reliability will be briefly explained.

Figure 8:
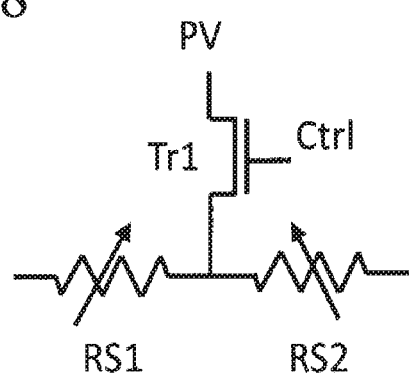
FIG. 8 illustrates a typical 1T2R NVRC.

FIG. 8 illustrates a typical 1T2R NVRC whose OFF-state reliability is better than that of 1T1R NVRC used in the time-multiplexed switch elements according to the above-mentioned first and second embodiments. Two NVRSs RS1 and RS2 are connected in series in the opposite direction. NVRSs RS1 and RS2 that are in the OFF-state complementarily divide the voltage stress to greatly enlarge the OFF-state lifetime. Write control transistor Tr1 which is controlled by write control signal Ctrl couples the common terminal of NVRSs RS1 and RS2 to program voltage PV for write operation.

Figure 9:
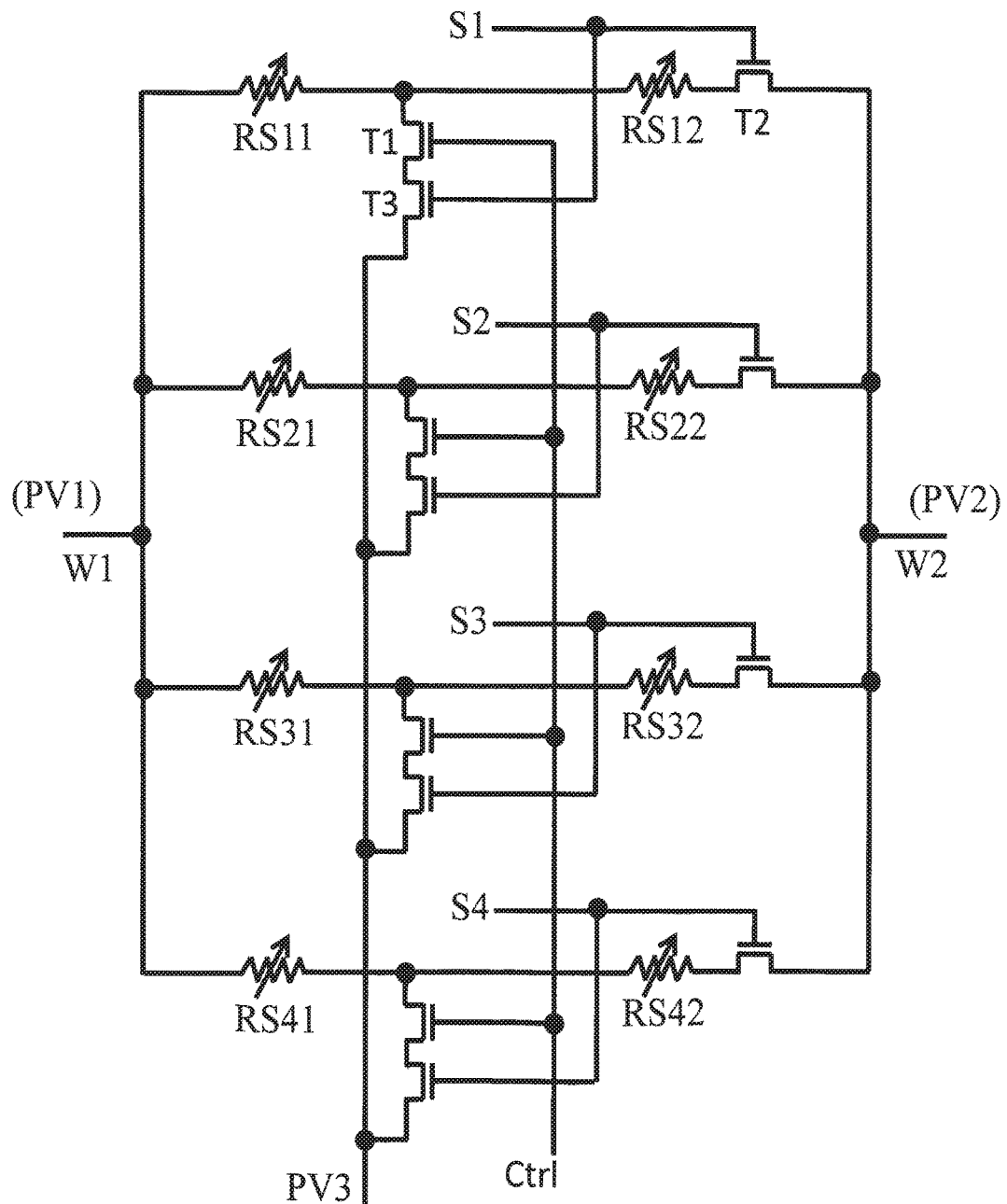
FIG. 9 illustrates a time-multiplexed switch element using typical 1T2R NVRCs.

FIG. 9 illustrates a typical 1T2R-NVRC-based time-multiplexed switch element. For example, the first path is composed of a 1T2R-NVRC (RS11, RS12 and T1) and two time-state-control transistors T2 and T3. Time-state-control transistor T2 on the data routing path is used for both the write and data routing modes, while time-state-control transistor T3 which is connected to a program voltage PV3 is only used for the write mode.

In the write mode, program voltages PV1 and PV2 are supplied to wires W1 and W2, respectively. When we want to write RS11 and RS12, both write control signal Ctrl and time control signal S1 are set to HIGH, so that program voltage signals PV1, PV2 and PV3 are supplied to the terminals of NVRSs RS11 and RS12 for write operation. In the data routing mode, write control signal Ctrl is set to LOW to isolate program voltage signal PV3. Time control signals T1-T4 can select one of the four paths according to time control signals S1-S4 to realize the time-multiplexed data routing.

Similar to the typical 1T1R-NVRC-based time-multiplexed switch element shown in FIG. 3, the above-mentioned typical 1T2R-NVRC-based time-multiplexed switch element also has a reset reliability problem. Program voltage signal PV3 is supplied to the common terminal of NVRSs RS11 and RS12 through two cascade-connected nMOS transistors T1 and T2, which causes heavy voltage level degradation of PV3. As a result, RS11 and RS12 may not be correctly reset.

To overcome the reset reliability problem, write and time control transistor sharing method as disclosed in the above-mentioned first embodiment is introduced to the 1T2R-NVRC-based time-multiplexed switch element.

Figure 10:
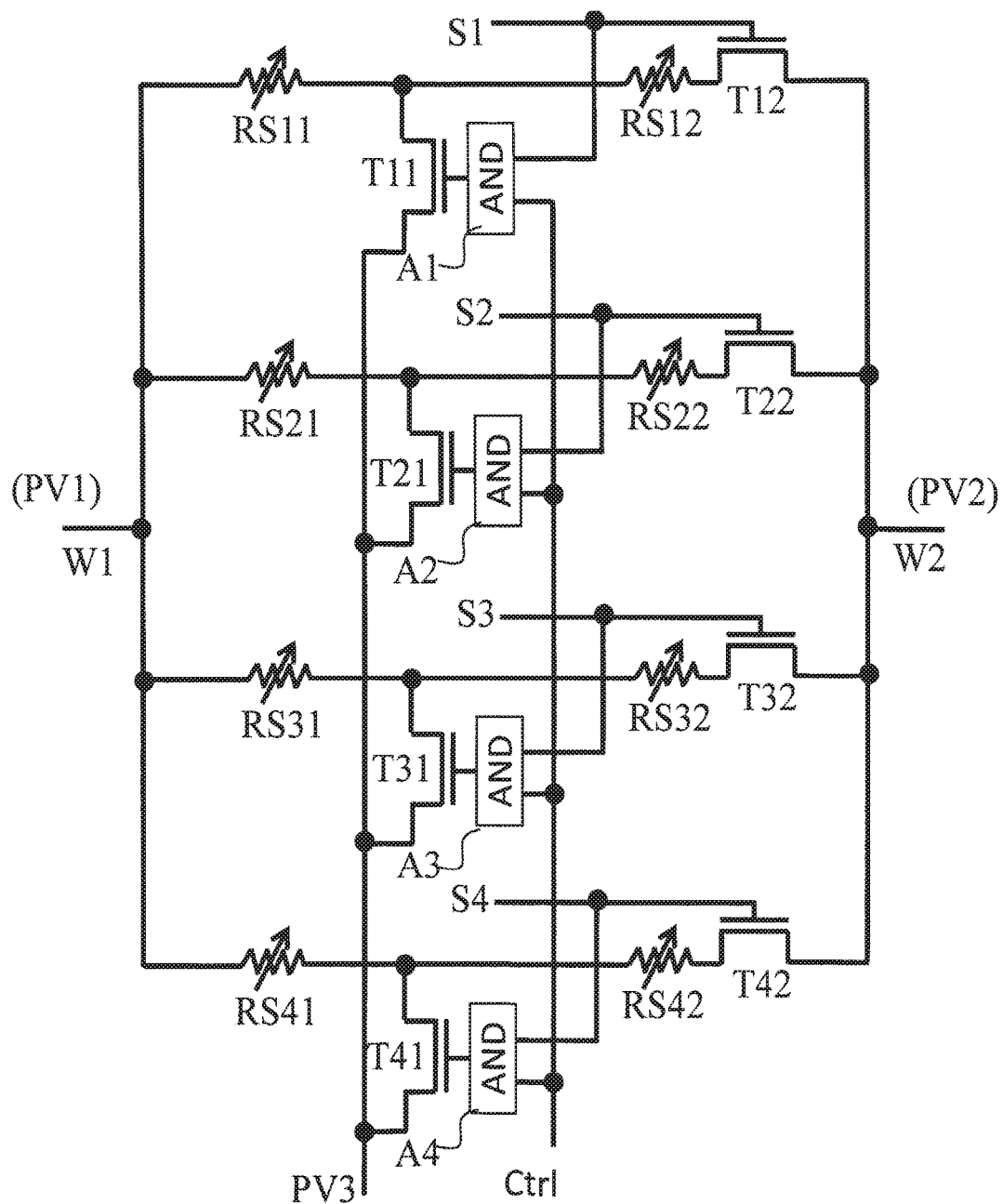
FIG. 10 illustrates a 1-transistor-2-NVRS resistive cell (1T2R-NVRC)-based time-multiplexed switch element according to a third exemplary embodiment of the present invention.

FIG. 10 illustrates a 1T2R-NVRC-based time-multiplexed switch element according to a third exemplary embodiment of the present invention. Four paths are parallel connected between two wires W1 and W2. The number of paths is not limited to four. Two or more paths may be parallel connected between wires W1 and W2.

The first path includes first NVRS RS11, second VRS RS12, transistors T11 and T12 and 2-input AND circuit A1. The first terminal of first NVRS RS11 is connected to wire W1 and the second terminal of first NVRS RS11 is connected to both the first terminal of second NVRS RS2 and the drain terminal of transistor T11. Program voltage signal PV3 is supplied to the source terminal of transistor T11. The second terminal of second NVRS RS2 is connected to the source terminal of transistor T12, and the drain terminal of transistor T12 is connected to wire W2.

The output of 2-input AND circuit A1 is connected to the gate terminal of transistor T11. Time control signal S1 is supplied to both the gate terminal of transistor T12 and the first data input of 2-input AND circuit A1. Write control signal Ctrl is supplied to the second data input of 2-input AND circuit A1.

The second path includes first NVRS RS21, second NVRS RS22, transistors T21 and T22 and 2-input AND circuit A2. The third path includes first NVRS RS31, second NVRS RS32, transistors T31 and T32 and 2-input AND circuit A3. The fourth path includes first NVRS RS41, second NVRS RS42, transistors T41 and T42 and 2-input AND circuit A4. In these paths, the first and second NVRSs, the transistor and the 2-input AND circuit are connected in a manner similar to the connection structure of the first path.

In the above-mentioned 1T2R-NVRCs, on each path, program voltage signal PV3 is supplied to the common terminal of the first and second NVRSs through only one nMOS transistor whose gate terminal is controlled by the 2-input AND circuit. For example, on the first path, time control signal S1 and write control signal Ctrl are supplied to the two input terminals of 2-input AND circuit A1. When both time control signal S1 and write control signal Ctrl are HIGH, nMOS transistor T11 is turned ON for write operation.

Figure 11:
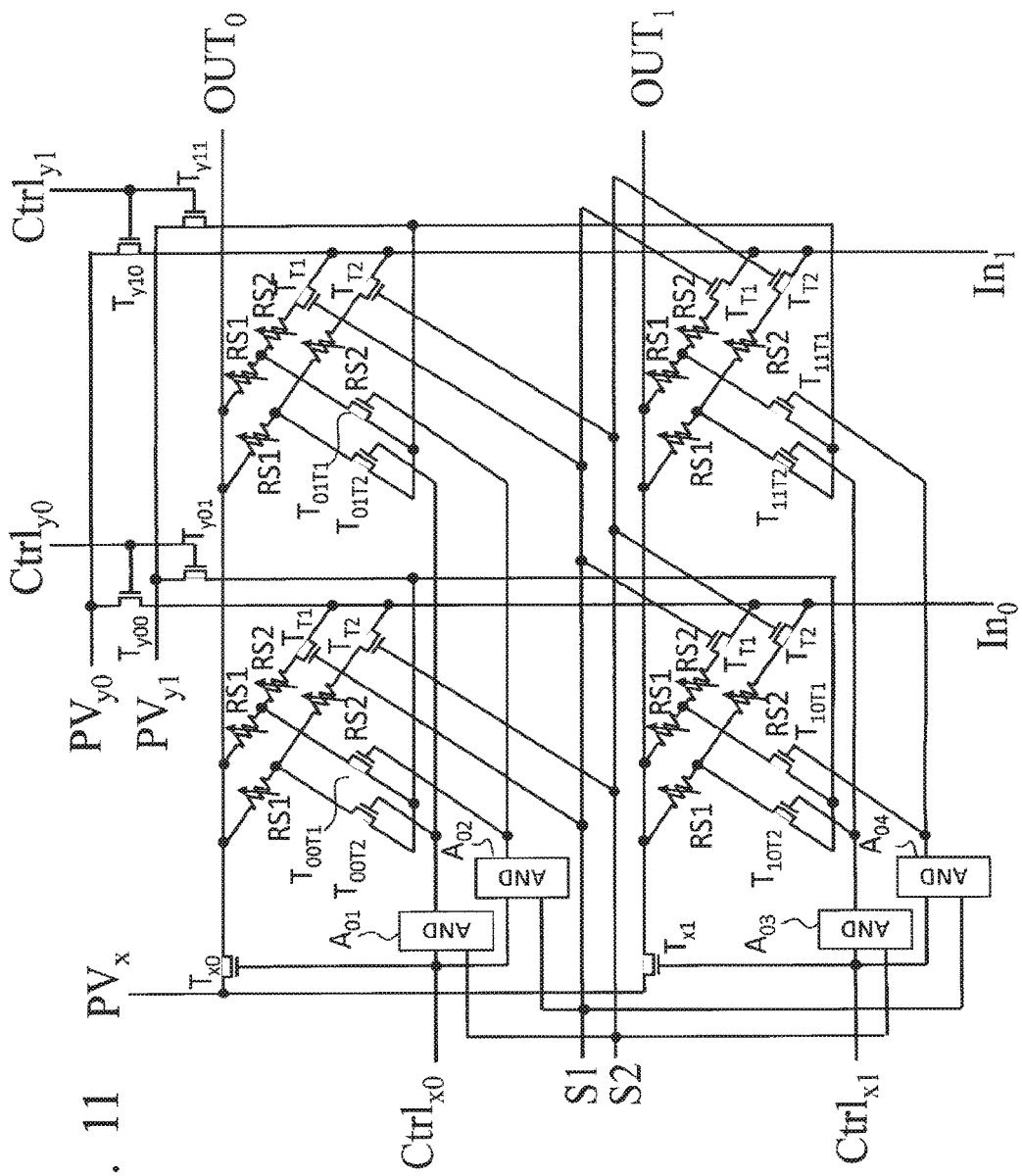
FIG. 11 illustrates a crossbar switch using 1T2R-NVRC-based time-multiplexed switch elements as shown in FIG. 10.

FIG. 11 illustrates a 1T2R-NVRS-based time-multiplexed crossbar switch (which uses a 2×2 crossbar switch and two time states as an example) that includes two column wires and two row wires. At each crosspoint, the proposed 1T2R-NVRC-based time-multiplexed switch element with 2 paths couples a column wire to a row wire. The column and row wires are used for both the data transfer and the NVRS write operation. Data is supplied to the bottom terminals of column wires, and to output from the right terminals of row wires.

Each column wire includes the first and second column wires. At each crosspoint, one terminal of each path is connected to the row wire and the other terminal of each path is connected to the first column wire. Each path includes first NVRS RS1 (which corresponds to NVRSs RS11, RS21, RS31, RS41 as shown FIG. 10) and second NVRS RS2 (which corresponds to NVRSs RS12, RS22, RS32, RS42 as shown FIG. 10).

The drain terminals of row write control transistors $T_{x0}$ and $T_{x1}$ are connected to common row program voltage line $PV_x$. The source terminal of row write control transistors $T_{x0}$ is connected to the left terminal of the row wire in row x0. Row write control signal $Ctrl_{x0}$ is supplied to the gate terminal of row write control transistors $T_{x0}$. Row write control transistors $T_{x0}$ operates according to row write control signal $Ctrl_{x0}$ and couples the left terminal of the row wire in row x0 to common row program voltage line $PV_x$.

The source terminal of row write control transistors $T_{x1}$ is connected to the left terminal of the row wire in row x1. Row write control signal $Ctrl_{x1}$ is supplied to the gate terminal of row write control transistors $T_{x1}$. Row write control transistors $T_{x1}$ operates according to row write control signal $Ctrl_{x1}$ and couples the left terminal of the row wire in row x1 to common row program voltage line $PV_x$.

First column write control transistors $T_{y00}$ and $T_{y10}$ couple the top terminals of the first column wires in columns y0 and y1 to a common first column program voltage line $PV_{y0}$. The drain terminals of first column write control transistors $T_{y00}$ and $T_{y10}$ are connected to common first column program voltage line $PV_{y0}$. The source terminal of first column write control transistor $T_{y00}$ is connected to the top terminal of the first column wire in column y0. The source terminal of first column write control transistor $T_{y10}$ is connected to the top terminal of the first column wire in column y1. Row write control signal $Ctrl_{y0}$ is supplied to the gate terminal of first column write control transistor $T_{y00}$ and row write control signal $Ctrl_{y1}$ is supplied to the gate terminal of first column write control transistor $T_{y10}$. First column write control transistors $T_{y00}$ and $T_{y10}$ are controlled by row write control signals $Ctrl_{y0}$ and $Ctrl_{y1}$.

Second column write control transistors $T_{y01}$ and $T_{y11}$ couple the top terminals of the second column wires in columns y0 and y1 to common second column program voltage line $PV_{y1}$. The drain terminals of second column write control transistors $T_{y01}$ and $T_{y11}$ are connected to common second column program voltage line $PV_{y1}$. The source terminal of second column write control transistor $T_{y01}$ is connected to the top terminal of the second column wire in column y0. The source terminal of second column write control transistor $T_{y11}$ is connected to the top terminal of the second column wire in column y1. Row write control signal $Ctrl_{y0}$ is supplied to the gate terminal of second column write control transistor $T_{y01}$ and row write control signal $Ctrl_{y1}$ is supplied to the gate terminal of second column write control transistor $T_{y11}$. Second column write control transistors $T_{y01}$ and $T_{y11}$ are controlled by row write control signals $Ctrl_{y0}$ and $Ctrl_{y1}$.

In row x0 and column y0, the drain terminals of nMOS transistors $T_{T1}$ and $T_{T2}$ are connected to the first column wire and the source terminals of nMOS transistors $T_{00T1}$ and $T_{00T2}$ are connected to the second column wire. Similarly, in row x1 and column y0, the drain terminals of nMOS transistors $T_{T1}$ and $T_{T2}$ are connected to the first column wire and the source terminals of nMOS transistors $T_{10T1}$ and $T_{10T2}$ are connected to the second column wire. All nMOS transistors $T_{00T1}$, $T_{00T2}$, $T_{10T1}$ and $T_{10T2}$ in column y0 are connected with each other and then coupled to second column program voltage line $PV_{y1}$ by second column write control transistor $T_{y01}$.

In row x0 and column y01, the drain terminals of nMOS transistors $T_{T1}$ and $T_{T2}$ are connected to the first column wire and the source terminals of nMOS transistors $T_{01T1}$ and $T_{01T2}$ are connected to the second column wire. Similarly, in row x1 and column y1, the drain terminals of nMOS transistors $T_{T1}$ and $T_{T2}$ are connected to the first column wire and the source terminals of nMOS transistors $T_{11T1}$ and $T_{11T2}$ are connected to the second column wire. All nMOS transistors $T_{01T1}$, $T_{01T2}$, $T_{11T1}$ and $T_{11T2}$ in column y1 are connected with each other and then coupled to common second column program voltage line $PV_{y1}$ by second column write control transistor $T_{y11}$.

Four 2-input AND circuits $A_{01}$, $A_{02}$, $A_{03}$ and $A_{04}$ are used to control nMOS transistors $T_{00T1}$, $T_{00T2}$, $T_{10T1}$, $T_{10T2}$, $T_{01T1}$, $T_{01T2}$, $T_{11T1}$ and $T_{11T2}$ to write the NVRSs in different paths. One 2-input AND circuit is shared to control nMOS transistors on same time-state paths in the same row.

The output of 2-input AND circuit $A_{01}$ is shared to control nMOS transistors $T_{00T2}$ and $T_{01T2}$. AND2 is shared to control $T_{00T2}$ and $T_{01T2}$. The output of 2-input AND circuit $A_{02}$ is shared to control nMOS transistors $T_{00T1}$ and $T_{01T1}$. The output of 2-input AND circuit $A_{03}$ is shared to control nMOS transistors $T_{10T2}$ and $T_{11T2}$. The output of 2-input AND circuit $A_{04}$ is shared to control nMOS transistors $T_{10T1}$ and $T_{11T1}$.

Row write control signal $Ctrl_{x0}$ is supplied to the first terminals of 2-input AND circuits $A_{01}$ and $A_{02}$, and row write control signal $Ctrl_{x1}$ is supplied to the first terminals of 2-input AND circuits $A_{03}$ and $A_{04}$. Time control signal S1 is supplied to the second terminals of 2-input AND circuits $A_{02}$ and $A_{04}$, and time control signal S2 is supplied to the second terminals of 2-input AND circuits $A_{01}$ and $A_{03}$. Four nMOS transistors $T_{T1}$ at different crosspoints with same active time state T1 are connected to time control signal S1, and 4 nMOS transistors $T_{T2}$ at different crosspoints with same active time state T2 are connected to time control signal S2.

In the write mode, if we want to write first NVRS RS1 and second NVRS RS2, row write control signal $Ctrl_{x1}$, column write control signal $Ctrl_{y0}$ and time control signal S2 are set to HIGH, row write control signal $Ctrl_{x0}$, column write control signal $Ctrl_{y1}$ and time control signal S1 are set to LOW, so that program voltage signals $PV_x$, $PV_{y0}$ and $PV_{y1}$ are supplied to terminals of first NVRS RS1 and second NVRS RS2 for a write operation.

In the data routing mode, write control signals $Ctrl_{x0}$, $Ctrl_{x1}$, $Ctrl_{y0}$ and $Ctrl_{y1}$ are all set to LOW to isolate program voltage signals $PV_x$, $PV_{y0}$ and $PV_{y1}$ from the column and row wires. Time control signals S1 and S2 control nMOS transistors $T_{T1}$ and $T_{T2}$, respectively, to realize the time-multiplexed data routing.

Fourth Exemplary Embodiment

Next, a fourth exemplary embodiment according to the present invention will be described.

In the 1T2R-NVRC-based time-multiplexed crossbar switch shown in FIG. 11 (the above-mentioned third exemplary embodiment), the column wires are connected to the large size transistors ($T_{T1}$ and $T_{T2}$) whose load capacitance is much larger than that of the NVRS, which causes large delay and dynamic power consumption in the data routing mode. The present embodiment discloses a high-speed low-power NVRS-Transistor-NVRS-sandwiched (RTR) 1T2R-NVRC-based time-multiplexed crossbar switch in which such delay and dynamic power consumption can be reduced.

Figure 12:
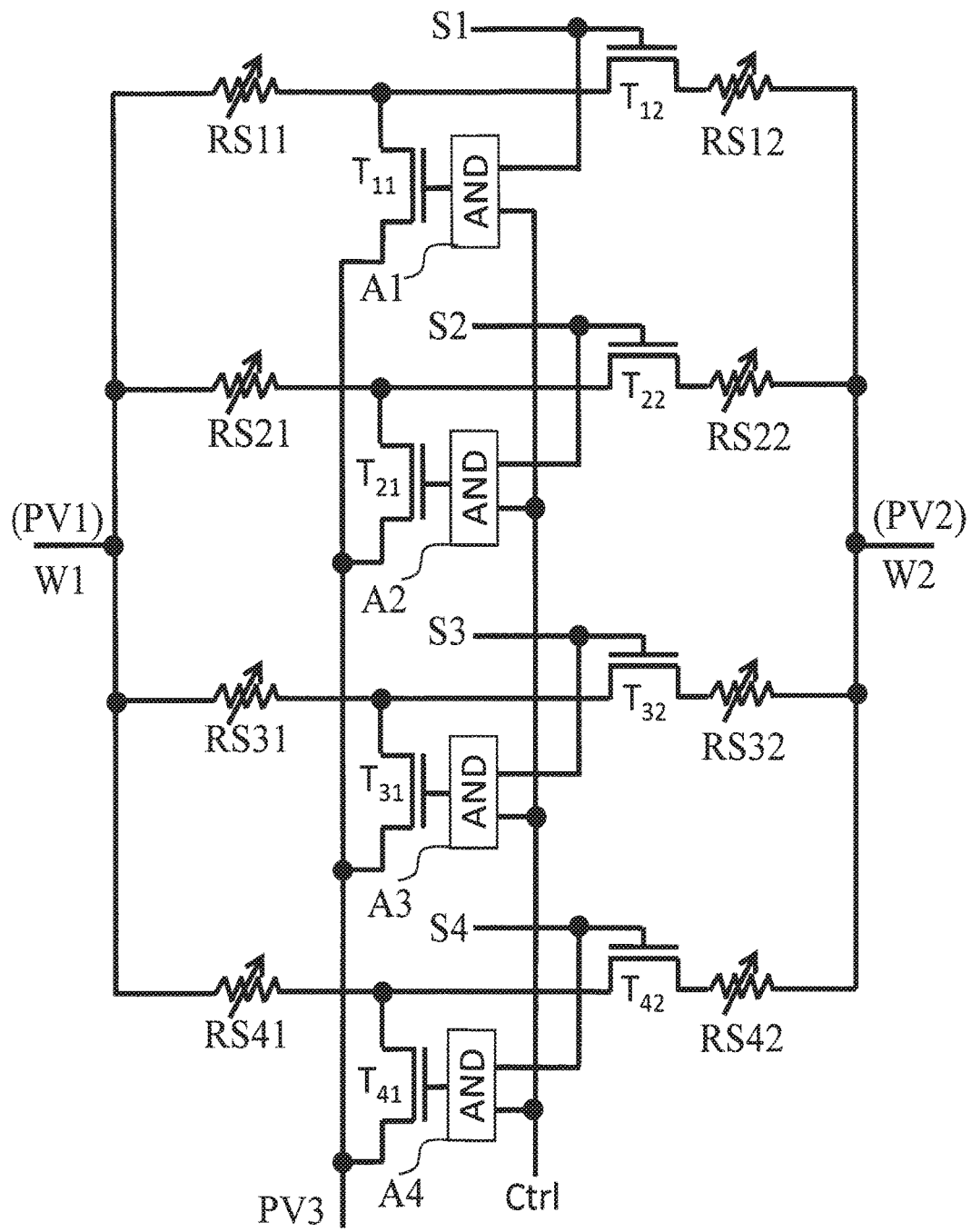
FIG. 12 illustrates a 1T2R-NVRC-based time-multiplexed switch element based on a NVRS-Transistor-NVRS sandwich structure according to a fourth exemplary embodiment of the present invention.

FIG. 12 illustrates a RTR 1T2R-NVRC-based time-multiplexed switch element according to the fourth exemplary embodiment which can overcome the above-mentioned problems. As shown in FIG. 12, four paths are parallel connected between two wires W1 and W2. The number of paths is not limited to four. Two or more paths may be parallel connected between wires W1 and W2.

On each path, a time control transistor (e.g. $T_{12}$, $T_{22}$, $T_{32}$ and $T_{42}$) is sandwiched by two NVRSs (e.g. RS11 and RS12). This point is different from the structure as shown FIG. 10.

More specifically, on the first path, the first terminal of first NVRS RS11 is connected to wire W1 and the second terminal of first NVRS RS11 is connected to the drain terminal of transistor $T_{11}$ and the source terminal of transistor $T_{12}$. The drain terminal of transistor $T_{12}$ is connected to the first terminal of second NVRS RS12 and the second terminal of second NVRS RS12 is connected to wire W2. In the second, third and fourth paths, the first and second NVRSs and the transistors are connected in a manner similar to the connection structure of the first path.

According to the RTR 1T2R-NVRC-based time-multiplexed switch element, both wires W1 and W2 are connected to the NVRSs instead of the large size transistor (e.g. $T_{12}$, $T_{22}$, $T_{32}$ and $T_{42}$). Thus, in comparison with the above-mentioned 1T2R-NVRCs (the above-mentioned third exemplary embodiment), the delay and dynamic power consumption can be reduced. Non-patent document 3 discloses that NVRS has very small load capacitance.

Figure 13:
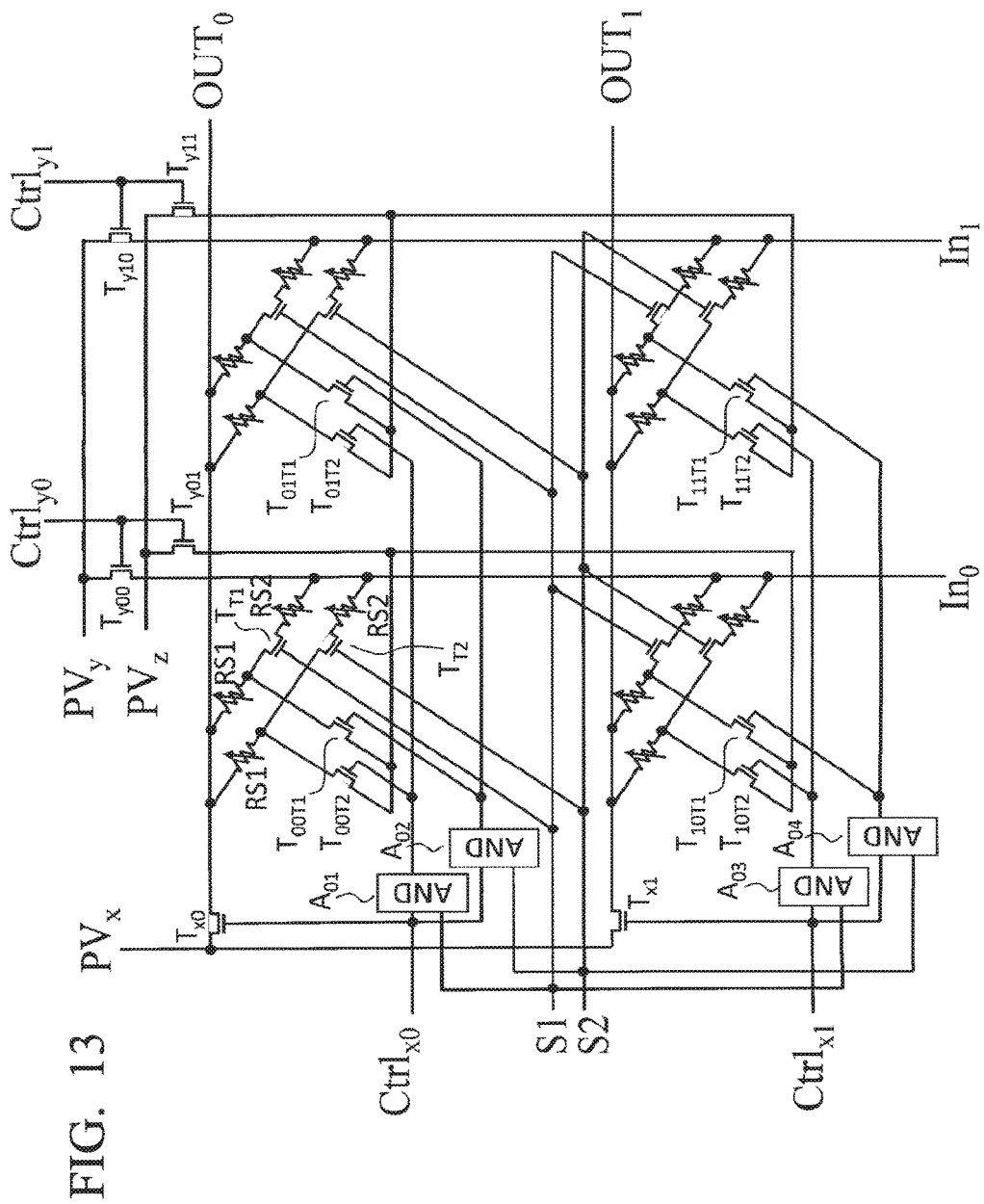
FIG. 13 illustrates a crossbar switch using 1T2R-NVRC-based time-multiplexed switch elements as shown in FIG. 12.

FIG. 13 shows a RTR 1T2R-NVRC-based time-multiplexed crossbar switch. At each crosspoint, the 1T2R-NVRC-based time-multiplexed switch element with two paths as shown FIG. 12 couples a column wire to a row wire. On each path, a time control transistor is sandwiched by two NVRSs. This point is different from the structure as shown FIG. 11.

More specifically, in row x0 and column y0, on the first path, the source terminal of nMOS transistor $T_{T1}$ is connected to the drain terminal of nMOS transistor $T_{00T1}$ and to the row wire through first NVRS RS1, and the drain terminal of nMOS transistor $T_{T1}$ is connected to the first column wire through second NVRS RS2. On the second path, the source terminal of nMOS transistor $T_{T2}$ is connected to the drain terminal of nMOS transistor $T_{00T2}$ and to the row wire through first NVRS RS1, and the drain terminal of nMOS transistor $T_{T2}$ is connected to the first column wire through second NVRS RS2. The source terminals of nMOS transistors $T_{00T1}$ and $T_{00T2}$ are connected to the second column wire.

In row x1 and column y0, on the first path, the source terminal of nMOS transistor $T_{T1}$ is connected to the drain terminal of nMOS transistor $T_{10T1}$ and to the row wire through first NVRS RS1, and the drain terminal of nMOS transistor $T_{T1}$ is connected to the first column wire through second NVRS RS2. On the second path, the source terminal of nMOS transistor $T_{T2}$ is connected to the drain terminal of nMOS transistor $T_{10T2}$ and to the row wire through first NVRS RS1, and the drain terminal of nMOS transistor $T_{T2}$ is connected to the first column wire through second NVRS RS2. The source terminals of nMOS transistors $T_{10T1}$ and $T_{10T2}$ are connected to the second column wire.

in row x0 and column y1, on the first path, the source terminal of nMOS transistor $T_{T1}$ is connected to the drain terminal of nMOS transistor $T_{01T1}$ and to the row wire through first NVRS RS1, and the drain terminal of nMOS transistor $T_{T1}$ is connected to the first column wire through second NVRS RS2. On the second path, the source terminal of nMOS transistor $T_{T2}$ is connected to the drain terminal of nMOS transistor $T_{01T2}$ and to the row wire through first NVRS RS1, and the drain terminal of nMOS transistor $T_{T2}$ is connected to the first column wire through second NVRS RS2. The source terminals of nMOS transistors $T_{01T1}$ and $T_{01T2}$ are connected to the second column wire.

In row x1 and column y1, on the first path, the source terminal of nMOS transistor $T_{T1}$ is connected to the drain terminal of nMOS transistor $T_{11T1}$ and to the row wire through first NVRS RS1, and the drain terminal of nMOS transistor $T_{T1}$ is connected to the first column wire through second NVRS RS2. On the second path, the source terminal of nMOS transistor $T_{T2}$ is connected to the drain terminal of nMOS transistor $T_{11T2}$ and to the row wire through first NVRS RS1, and the drain terminal of nMOS transistor $T_{T2}$ is connected to the first column wire through second NVRS RS2. The source terminals of nMOS transistors $T_{11T1}$ and $T_{11T2}$ are connected to the second column wire.

According to the above-mentioned RTR 1T2R-NVRC-based time-multiplexed crossbar switch, a time control transistor is sandwiched by two NVRSs on each path, so that the column wires are connected to the NVRSs but not the large size time control transistors. In the data routing mode, data $In_0$ is supplied to the bottom terminal of the first column wire in column y0 and data $In_1$ is supplied to the bottom terminal of the first column wire of column y1. Small load capacitance of the NVRSs leads to high-speed low-power data routing.

The present invention is not limited to the above described exemplary embodiments. The above described exemplary embodiments are one example of the present invention, and the configuration and operation thereof may be changed and/or modified as necessary without departing from the spirit of the invention. For example, in these embodiment, the non-volatile resistive switch may be composed of a metal oxide resistance change device or a solid electrolyte resistance change device.

The reconfigurable circuit of the present invention may be used in mobile phone, IoT (Internet of Things) devices, and so on.

The present invention can employ the following forms. However, the forms are in no way limitative of the invention.

(Supplementary Note 1) A reconfigurable circuit comprising:
first and second wires; and
two or more paths that are active at different times and that are configured to couple said first wire to said second wire,
wherein each path includes:
a first non-volatile resistive switch, whose first terminal is connected to said first wire;
a first transistor whose drain terminal is connected to a second terminal of said non-volatile resistive switch and whose source terminal is connected to said second wire; and
a 2-input AND circuit whose output is connected to a gate terminal of said first transistor,
wherein a time control signal is supplied to a first data input of said 2-input AND circuit, and a write control signal is supplied to a second data input of said 2-input AND circuit.

(Supplementary Note 2) A reconfigurable circuit comprising:
first and second wires; and
two or more paths that are active at different times and that are configured to couple said first wire to said second wire,
wherein each path includes:
a first non-volatile resistive switch, whose first terminal is connected to said first wire;
a first transistor whose drain terminal is connected to a second terminal of said first non-volatile resistive switch;
a second non-volatile resistive switch whose first terminal is connected to said second terminal of said first non-volatile resistive switch;
a second transistor whose source terminal is connected to a second terminal of said second non-volatile resistive switch, and whose drain terminal is connected to said second wire; and
a 2-input AND circuit whose output is connected to a gate terminal of said first transistor,
wherein a time control signal is supplied to both a first data input of said 2-input AND circuit and a gate terminal of said second transistor, and a write control signal is supplied to a second data input of said 2-input AND circuit.

(Supplementary Note 3) A reconfigurable circuit comprising:
first and second wires; and
two or more paths that are active at different times and that are configured to couple said first wire to said second wire,
wherein each path includes:
a first non-volatile resistive switch, whose first terminal is connected to said first wire;
a first transistor whose drain terminal is connected to a second terminal of said first non-volatile resistive switch;
a second transistor whose source terminal is connected to a second terminal of said first non-volatile resistive switch;
a second non-volatile resistive switch whose first terminal is connected to a drain terminal of said second transistor and whose second terminal is connected to said second wire; and
a 2-input AND circuit whose output is connected to a gate terminal of said first transistor,
wherein a time control signal is supplied to both a first data input of said 2-input AND circuit and a gate terminal of said second transistor, and a write control signal is supplied to a second data input of said 2-input AND circuit.

(Supplementary Note 4) The reconfigurable circuit according to Supplementary Note 2 or 3, wherein source terminals of said first transistors on said two or more paths are connected to a common program voltage line.

(Supplementary Note 5) The reconfigurable circuit according to any one of Supplementary Notes 1 to 3, wherein all said first data inputs of said 2-input AND circuits on said two or more paths are connected to a common write control signal line, and said second date inputs of said 2-input AND circuits on said two or more paths are connected to different time control signal lines.

(Supplementary Note 6) The reconfigurable circuit according to any one of Supplementary Notes 1 to 3, wherein two or more row wires are provided as said first wire and two or more column wires are provided as said second wire,
wherein at each crosspoint of said two or more row wires and said two or more column wires, said two or more paths are used to couple one of said two or more row wires to one of said two or more column wires.

(Supplementary Note 7) The reconfigurable circuit according to Supplementary Note 6, wherein said output of said 2-input AND circuit is connected to gate terminals of said first transistors on paths that are provided at different crosspoints of the same row and that are active at the same time.

(Supplementary Note 8) The reconfigurable circuit according to Supplementary Note 1, wherein two or more row wires are provided as said first wire and two or more column wires are provided as said second wire,
wherein at each crosspoint of said two or more row wires and said two or more column wires, said two or more paths are used to couple one of said two or more row wires to one of said two or more column wires,
wherein said reconfigurable circuit further comprises:
a plurality of column write enable transistors that are provided for every said column wire, a source terminal of each column write enable transistor being connected to a corresponding column wire;
a plurality of row write control transistors that are provided for every said row wire, a gate terminal of each row write control transistor being connected to a row write control signal line and a source terminal of each row write control transistor being connected to a corresponding row wire; and
a plurality of row write enable transistors that are provided for every said row wire, a source terminal of each row write enable transistor being connected to a drain terminal of a corresponding row write control transistor and a drain terminal of each row write enable transistor being connected to a row program voltage line that is provided for a corresponding row wire, wherein gate terminals of said plurality of column write enable transistors and gate terminals of said plurality of row write enable transistors are connected to a common write enable signal line.

(Supplementary Note 9) The reconfigurable circuit according to Supplementary Note 2 or 3, wherein two or more row wires are provided as said first wire and two or more column wires are provided as said second wire, wherein at each crosspoint of said two or more row wires and said two or more column wires, said two or more paths are used to couple one of said two or more row wires to one of said two or more column wires, wherein said reconfigurable circuit further comprises:

a plurality of column write control transistors that are provided for every said column wire, a drain terminal of each column write control transistor being connected to a common column program voltage line and a source terminal of each first column write control transistor being connected to a corresponding column wire; and a plurality of row write control transistors that are provided for every said row wire, a drain terminal of each row write control transistor being connected to a common row program voltage line and a source terminal of each row write control transistor being connected to a corresponding row wire, wherein column write control signals are supplied to gate terminals of said column write transistors one-to-one, and row write control signals are supplied to gate terminals of said row write transistors one-to-one.

(Supplementary Note 10) The reconfigurable circuit according to Supplementary Note 2 or 3, wherein two or more row wires are provided as said first wire and two or more column wires are provided as said second wire, each column wire including first and second column wires, wherein at each crosspoint of said two or more row wires and said two or more column wires, said two or more paths are used to couple one of said two or more row wires to one of said two or more column wires, wherein said reconfigurable circuit further comprises:

a plurality of first column write control transistors that are provided for every said first column wire, a drain terminal of each first column write control transistor being connected to a common first column program voltage line and a source terminal of each first column write control transistor being connected to a corresponding first column wire; a plurality of second column write control transistors that are provided for every said second column wire, a drain terminal of each second column write control transistor being connected to a common second column program voltage line and a source terminal of each second column write control transistor being connected to a corresponding second column wire; and a plurality of row write control transistors that are provided for every said row wire, a drain terminal of each row write control transistor being connected to a common row program voltage line and a source terminal of each row write control transistor being connected to a corresponding row wire, wherein source terminals of said first transistors on paths in the same column are connected with each other and then connected to a corresponding second column wire, and gate terminals of said first and second column write transistors that are provided in the same column are connected with each other and then connected to a column write control signal.

(Supplementary Note 11) The reconfigurable circuit according to any one of Supplementary Notes 8 to 10, wherein a common time control signal is supplied to second data inputs of said 2-input AND circuits whose outputs are connected to gate terminals of said first transistors on paths that are active at the same time, and a common row write control signal is supplied to first data inputs of said 2-input AND circuits whose outputs are connected to gate terminals of said first transistors on the paths that are provided in the same row.

(Supplementary Note 12) The reconfigurable circuit according to any one of Supplementary Notes 1 to 11, wherein said non-volatile resistive switch comprises a metal oxide resistance change device or a solid electrolyte resistance change device.

REFERENCE SIGNS LIST

A1-A4 2-input AND circuit
S1-S4 time control signal
Ctrl write control signal
T1-T4 pass transistor
W1, W2 wire
RS1-RS4 non-volatile resistive switch

What is claimed is:

1. A reconfigurable circuit comprising:
   first and second wires; and
   three or more paths that are active at different times and that are configured to couple said first wire to said second wire,
   wherein each path includes:
   a first non-volatile resistive switch, whose first terminal is connected to said first wire;
   a first transistor whose drain terminal is connected to a second terminal of said non-volatile resistive switch and whose source terminal is connected to said second wire; and
   a 2-input AND circuit whose output is connected to a gate terminal of said first transistor,
   wherein a time control signal is supplied to a first data input of said 2-input AND circuit, and a write control signal is supplied to a second data input of said 2-input AND circuit, and
   wherein all said first data inputs of said 2-input AND circuits on said three or more paths are connected to a common write control signal line, and said second data inputs of said 2-input AND circuits on said three or more paths are connected to different time control signal lines.

2. The reconfigurable circuit according to claim 1, wherein two or more row wires are provided as said first wire and two or more column wires are provided as said second wire,
   wherein at each crosspoint of said two or more row wires and said two or more column wires, two or more paths of said three or more paths are used to couple one of said two or more row wires to one of said two or more column wires.

3. The reconfigurable circuit according to claim 2, wherein said output of said 2-input AND circuit is connected to gate terminals of said first transistors on paths that are provided at different crosspoints of the same row and that are active at the same time.

4. The reconfigurable circuit according to claim 1,
wherein two or more row wires are provided as said first wire and two or more column wires are provided as said second wire,
wherein at each crosspoint of said two or more row wires and said two or more column wires, two or more paths of said three or more paths are used to couple one of said two or more row wires to one of said two or more column wires,
wherein said reconfigurable circuit further comprises:
a plurality of column write enable transistors that are provided for every said column wire, a source terminal of each column write enable transistor being connected to a corresponding column wire;
a plurality of row write control transistors that are provided for every said row wire, a gate terminal of each row write control transistor being connected to a row write control signal line and a source terminal of each row write control transistor being connected to a corresponding row wire; and
a plurality of row write enable transistors that are provided for every said row wire, a source terminal of each row write enable transistor being connected to a drain terminal of a corresponding row write control transistor and a drain terminal of each row write enable transistor being connected to a row program voltage line that is provided for a corresponding row wire,
wherein gate terminals of said plurality of column write enable transistors and gate terminals of said plurality of row write enable transistors are connected to a common write enable signal line.

5. A reconfigurable circuit comprising:
first and second wires; and
two or more paths that are active at different times and that are configured to couple said first wire to said second wire,
wherein each path includes:
a first non-volatile resistive switch, whose first terminal is connected to said first wire;
a first transistor whose drain terminal is connected to a second terminal of said first non-volatile resistive switch;
a second non-volatile resistive switch whose first terminal is connected to said second terminal of said first non-volatile resistive switch;
a second transistor whose source terminal is connected to a second terminal of said second non-volatile resistive switch, and whose drain terminal is connected to said second wire; and
a 2-input AND circuit whose output is connected to a gate terminal of said first transistor,
wherein a time control signal is supplied to both a first data input of said 2-input AND circuit and a gate terminal of said second transistor, and a write control signal is supplied to a second data input of said 2-input AND circuit.

6. The reconfigurable circuit according to claim 5, wherein source terminals of said first transistors on said two or more paths are connected to a common program voltage line.

7. The reconfigurable circuit according to claim 5,
wherein two or more row wires are provided as said first wire and two or more column wires are provided as said second wire,
wherein at each crosspoint of said two or more row wires and said two or more column wires, said two or more paths are used to couple one of said two or more row wires to one of said two or more column wires,
wherein said reconfigurable circuit further comprises:
a plurality of column write control transistors that are provided for every said column wire, a drain terminal of each column write control transistor being connected to a common column program voltage line and a source terminal of each first column write control transistor being connected to a corresponding column wire; and
a plurality of row write control transistors that are provided for every said row wire, a drain terminal of each row write control transistor being connected to a common row program voltage line and a source terminal of each row write control transistor being connected to a corresponding row wire,
wherein column write control signals are supplied to gate terminals of said column write transistors one-to-one, and row write control signals are supplied to gate terminals of said row write transistors one-to-one.

8. The reconfigurable circuit according to claim 5,
wherein two or more row wires are provided as said first wire and two or more column wires are provided as said second wire, each column wire including first and second column wires,
wherein at each crosspoint of said two or more row wires and said two or more column wires, said two or more paths are used to couple one of said two or more row wires to one of said two or more column wires,
wherein said reconfigurable circuit further comprises:
a plurality of first column write control transistors that are provided for every said first column wire, a drain terminal of each first column write control transistor being connected to a common first column program voltage line and a source terminal of each first column write control transistor being connected to a corresponding first column wire;
a plurality of second column write control transistors that are provided for every said second column wire, a drain terminal of each second column write control transistor being connected to a common second column program voltage line and a source terminal of each second column write control transistor being connected to a corresponding second column wire; and
a plurality of row write control transistors that are provided for every said row wire, a drain terminal of each row write control transistor being connected to a common row program voltage line and a source terminal of each row write control transistor being connected to a corresponding row wire,
wherein source terminals of said first transistors on paths in the same column are connected with each other and then connected to a corresponding second column wire, and gate terminals of said first and second column write transistors that are provided in the same column are connected with each other and then connected to a column write control signal.

9. A reconfigurable circuit comprising:
first and second wires; and
two or more paths that are active at different times and that are configured to couple said first wire to said second wire,
wherein each path includes:
a first non-volatile resistive switch, whose first terminal is connected to said first wire;

a first transistor whose drain terminal is connected to a second terminal of said first non-volatile resistive switch;
a second transistor whose source terminal is connected to a second terminal of said first non-volatile resistive switch;
a second non-volatile resistive switch whose first terminal is connected to a drain terminal of said second transistor and whose second terminal is connected to said second wire; and
a 2-input AND circuit whose output is connected to a gate terminal of said first transistor,
wherein a time control signal is supplied to both a first data input of said 2-input AND circuit and a gate terminal of said second transistor, and a write control signal is supplied to a second data input of said 2-input AND circuit.

* * * * *